(12) United States Patent
Origasa et al.

(10) Patent No.: US 7,312,649 B2
(45) Date of Patent: Dec. 25, 2007

(54) VOLTAGE BOOSTER POWER SUPPLY CIRCUIT

(75) Inventors: Kenichi Origasa, Takatsuki (JP); Kiyoto Ohta, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/820,033

(22) Filed: Apr. 8, 2004

(65) Prior Publication Data

US 2004/0207458 A1  Oct. 21, 2004

(30) Foreign Application Priority Data

Apr. 17, 2003  (JP)  ............... 2003-112248

(51) Int. Cl.
*G05F 1/46* (2006.01)
*H02M 3/00* (2006.01)

(52) U.S. Cl. .................. 327/536; 363/59; 365/189.09

(58) Field of Classification Search ..................... None
See application file for complete search history.

(56) References Cited

U.S. PATENT DOCUMENTS 6,140,862 A * 10/2000 Hagura ....................... 327/537
6,195,305 B1 * 2/2001 Fujisawa et al. ............. 365/226
6,285,622 B1 * 9/2001 Haraguchi et al. .......... 365/226
6,424,578 B2 * 7/2002 Sim et al. ............... 365/189.09
6,628,555 B2   9/2003 Kondo et al. .......... 365/189.09

FOREIGN PATENT DOCUMENTS

| JP | 03-035493 | 2/1991 |
|----|-----------|--------|
| JP | 05-129555 | 5/1993 |
| JP | 06-217528 | 8/1994 |
| JP | 06-335237 | 12/1994 |
| JP | 07-078471 | 3/1995 |
| JP | 07-194098 | 7/1995 |
| JP | 2001-110184 | 4/2001 |
| JP | 2001-250381 | 9/2001 |

* cited by examiner

*Primary Examiner*—Kenneth B. Wells
*Assistant Examiner*—Terry L. Englund
(74) *Attorney, Agent, or Firm*—Steptoe & Johnson LLP

(57) ABSTRACT

A voltage booster power supply circuit using a first voltage VDD3 and a second voltage VDDM to boost the first voltage VDD3, which is higher than the second voltage, to provide a boosted voltage VPP. Thus, a high efficiency of generation of a boosted voltage can be achieved compared with a configuration in which only the second voltage is used to boost the first voltage. A detector circuit detects the boosted voltage VPP to control a voltage booster circuit.

19 Claims, 17 Drawing Sheets

VOLTAGE BOOSTER POWER SUPPLY CIRCUIT

FIELD OF THE INVENTION

The present invention relates to a voltage booster circuit that generates a voltage required for a function block (for example, a memory device) consisting of semiconductor integrated circuits.

BACKGROUND OF THE INVENTION

A conventional voltage booster circuit is supplied with a single power supply as an external power source. If a voltage more than twice as high as that generated by the external power source is required, an arrangement such as a voltage tripler is used. If the voltage supplied by an external power source is relatively high, the entire voltage booster circuit is formed by a transistor having a relatively thick gate oxide film (see Japanese Patent Laid-Open No. 2001-250381, for example).

It is difficult for a conventional voltage booster circuit, which is supplied with one power supply as an external power source, to provide a sufficient supply capacity if the voltage of the external power source is low. Although a required voltage can be achieved by using a voltage-tripler, the efficiency of current conversion will be significantly reduced.

If the voltage of the external power source is adequately high, then the entire voltage booster circuit must be formed with a transistor having a relatively thick gate oxide film, which takes up more circuit space. Furthermore, if the voltage of the external power source is sufficiently high, the voltage can be boosted to a value that the transistors that form the circuit cannot withstand, and consequently the life of the product may be reduced.

The present invention solves the problems associated with the prior art and an object of the present invention is to provide an arrangement capable of using a plurality of power sources to supply an adequate voltage to a system-on-chip (SOC), which is a large-scale semiconductor integrated circuit, without increasing circuit space.

Another object of the present invention is to provide an arrangement that can avoid overboost beyond the withstand voltage of transistors if an external voltage is higher than necessary.

DISCLOSURE OF THE INVENTION

In order to achieve the object, the present invention provides a voltage booster power supply circuit that generates a voltage for use in a functional block, wherein first and second voltages and a ground voltage are supplied, the second voltage being lower than the first voltage, a timing signal is generated by a timing generator circuit according to the second voltage, a boosted voltage for use in the functional block is generated by boosting the first voltage according to the timing signal.

Because the first and second voltages are used to boost the first voltage, which is higher than the second voltage, this configuration can provide a higher efficiency than a conventional configuration in which only the second voltage is used to boost the first voltage.

An example of the voltage booster power supply circuit comprises a detector circuit and a voltage booster circuit, wherein the voltage booster circuit comprises a timing generator circuit, a level shifter circuit, and a charge pump circuit, wherein the timing generator circuit is supplied with the second voltage and outputs a timing signal at a level of the second voltage to the level shifter circuit, the level shifter circuit outputs a timing signal at a level of the first voltage to the charge pump circuit, the charge pump circuit is supplied with the first voltage and generates a boosted voltage according to the timing signal at a level of the first voltage, and the detector circuit detects the boosted voltage to activate the timing generator circuit.

This configuration can provide a sufficient voltage generation capacity without increasing circuit space because the most appropriate voltage is supplied to the most appropriate block among the internal blocks of the voltage booster power supply circuit of the present invention.

Another example of the voltage booster power supply circuit comprises a detector circuit and a voltage booster circuit, wherein the detector circuit comprises a voltage conversion circuit, a standard voltage generator circuit, and a comparator circuit, the voltage conversion circuit provides a first standard voltage by decreasing a voltage for use in the functional block, the standard voltage generator circuit provides a second standard voltage by decreasing the first voltage to a predetermined voltage, and the comparator circuit compares the first standard voltage with the second standard voltage and, if the first standard voltage is lower than the second standard voltage, activates the voltage booster circuit, or if the first standard voltage is higher than the second standard voltage, deactivates the voltage booster circuit.

The standard voltage generator circuit has a voltage adjustment unit comprising an electric fuse, the voltage adjustment unit being used to adjust the second standard voltage to adjust a voltage for use in the functional block. In this configuration, the second standard voltage can be adjusted in a relatively easy manner by using the adjustment unit such as a fuse to adjust the second voltage. Thus, variations in voltage after manufacturing can be corrected.

Another example of the voltage booster power supply circuit is supplied with first and second voltages and a ground voltage. The second voltage is lower than the first voltage, the voltage booster circuit converts the first voltage to produce a voltage for use in a functional block. The voltage booster circuit comprises a detector circuit and voltage booster circuit, wherein the detector circuit comprises a voltage conversion circuit, a standard voltage generator circuit, a comparator circuit, and a voltage step-down circuit. The voltage conversion circuit provides a first standard voltage by decreasing a voltage for use in the functional block, the standard voltage generator circuit provides a second standard voltage by decreasing the first voltage to a predetermined voltage, the comparator circuit compares the first standard voltage with the second standard voltage and, if the first standard voltage is lower than the second standard voltage, activates the voltage booster circuit, or if the first standard voltage is higher than the second standard voltage, deactivates the voltage booster circuit, and the voltage step-down circuit decreases the voltage for use in the functional block if the voltage for use in the functional block is higher than a predetermined voltage.

In this configuration, the voltage step-down circuit comprises a transistor, the gate of the transistor is supplied with the second standard voltage, the source of the transistor is connected with a power supply line for providing a boosted voltage to the functional block, and the drain of the transistor is connected with a power supply line for providing a voltage lower than the first voltage.

The functional block comprises a memory circuit and the threshold of the transistor is approximate equal to the threshold of a transistor used in the memory circuit.

The voltage step-down circuit comprises an operational amplifier and a transistor, the gate of which is connected to the operational amplifier; the first and second standard voltages are inputted into the operational amplifier; the source of the transistor is connected to a power supply line for providing a boosted voltage to the functional block; and the drain of the transistor is connected to a power supply line of voltage lower than the first voltage.

The functional block comprises a logic circuit and the threshold value of the transistor is approximately equal to the threshold value of the transistor of the logic circuit.

The output section of the voltage booster power supply circuit may generate excessively high voltage depending on an external voltage supplied to the circuit. The voltage step-down circuit lowers such an excessively high voltage. Thus, an excessive voltage rise can be prevented and consequently damage to elements of the block to which an output voltage from the voltage booster power supply circuit is supplied can be prevented. Therefore reduction in life of the block can be prevented.

The drain of the transistor is connected to the power supply line of the second voltage. This allows it to reuse surplus charges.

The drain of the transistor may be connected to a ground voltage line. This increases the potential difference between the source and the drain of the transistor, resulting in an adequate capacity of the voltage step-down circuit.

The second standard voltage is lower than the boosted voltage provided to the functional block by approximately a threshold voltage of a diode connected to a load of the voltage conversion circuit in series.

Furthermore, the voltage conversion circuit comprises a transistor and a load, the transistor is a diode-connected transistor, the drain of the transistor is connected to the load, the load is connected to a ground voltage terminal, the source of the transistor is supplied with the boosted voltage, and a first standard voltage is outputted from a connection point between the drain of the transistor and the load.

The voltage booster power supply circuit further comprises a charge pump circuit that is driven by a timing signal produced from the timing signal by converting the voltage level of the timing signal to the first voltage level, thereby generating the boosted voltage. The charge pump circuit comprises a plurality of transistors, the substrates of which are supplied with a voltage approximately equal to the second voltage.

The voltage at each terminal of a transistor of the charge pump circuit may rise up to twice as large the first voltage and as a result the potential difference between the voltage at the terminal and the voltage of the substrate may become so large that it poses the withstand voltage problem. The configuration described above can reduce the potential difference between the substrate and each voltage of the transistor of the charge pump circuit by setting the voltage of the substrate to a relatively high value.

The first voltage is equal to the voltage of a power supply provided to an input/output block by which the functional block provides data to and receives data from an external element. Thus, a typical I/O block supply voltage (for example 3.3 V, 2.5 V, or 1.8 V) can be used to provide a sufficient voltage supply capacity without having to provide a voltage supply dedicated to the voltage booster power supply circuit of the present invention.

The second voltage is equal to the voltage of a power supply provided to the functional block. This eliminates the need for providing a voltage dedicated to the voltage booster power supply circuit of the present invention.

The functional block comprises a dynamic random access memory.

The thickness of the gate oxide film of a transistor forming the timing generator circuit is thinner than the gate oxide film of a transistor forming the charge pump circuit.

This allows for space savings while achieving an adequate withstand voltage and capability of the transistors by forming portions that require a high voltage with transistors having a relatively thick film, which decreases packing density, and forming the other portions with transistors having relatively thin film (for example 2.6 nm thick) which can usually be provided in high density.

The present invention provides a voltage booster power supply circuit that generates a voltage for use in a functional block, wherein first and second voltages and a ground voltage are supplied, the second voltage being lower than the first voltage, a timing signal is generated by a timing generator circuit according to the second voltage, a boosted voltage for use in the functional block is generated by boost—converting the first voltage according to the timing signal, the voltage booster power supply circuit comprising a detector circuit and a voltage booster circuit, wherein the voltage booster circuit comprises a timing generator circuit, a level shifter circuit, and a charge pump circuit. The timing generator circuit is supplied with the second voltage and outputs a timing signal at a level of the second voltage to the level shifter circuit, the level shifter circuit outputs a timing signal at a level of the first voltage to the charge pump circuit, the charge pump circuit is supplied with the first voltage and generates a boosted voltage according to the timing signal at the first voltage. The timing generator circuit comprises an oscillator, and if the detector circuit detects that the output of the boosted voltage is lower than a predetermined voltage, the oscillator and the charge pump circuit are activated and the charge pump circuit is driven before the oscillator steadily generates a clock signal.

In this configuration, when generation of voltage is required, the oscillator, which is a typical oscillator, is activated. The first voltage pumping is accomplished before the oscillator becomes active and causing a constant voltage supply, thereby preventing a temporary voltage drop.

The timing generator circuit comprises a divider circuit, and if the detector circuit detects that the boosted voltage is lower than the predetermined voltage, the oscillator is activated and at the same time the divider circuit is set, the charge pump is activated before the oscillator steadily generates a clock signal, and if the detector circuit detects that the boosted voltage exceeds the predetermined voltage, the oscillator is deactivated and the divider is reset.

Furthermore, the divider circuit is formed by a plurality of D-flip-flops or T-flip-flops having a reset terminal and a set terminal.

DESCRIPTION OF THE EMBODIMENTS

Embodiments of the present invention will be described below with reference to FIGS. 1 to 17.

First Embodiment

Figure 1:
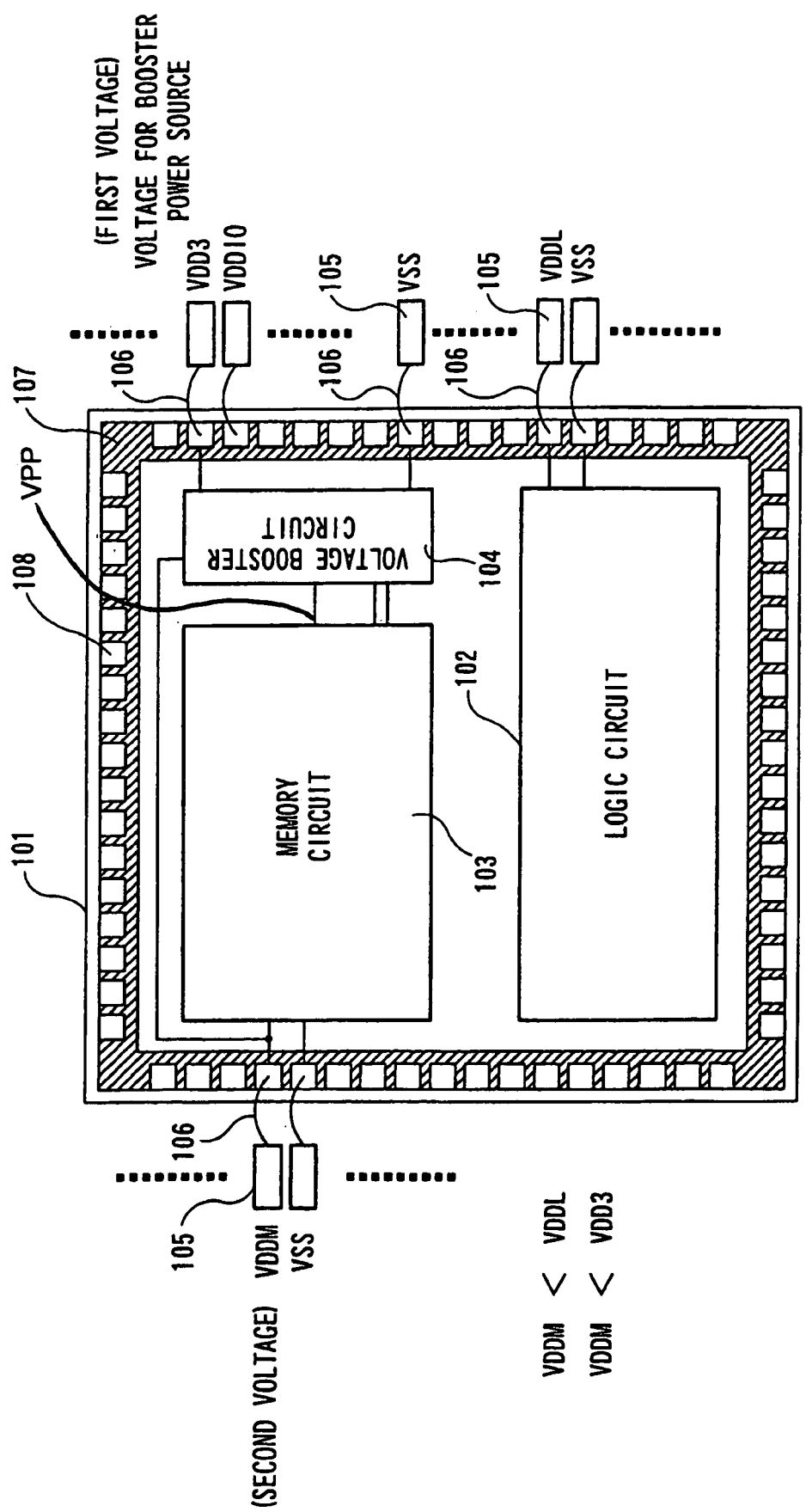
FIG. 1 is a block diagram of a large-scale semiconductor integrated circuit on which a voltage booster power supply circuit is provided according to a first embodiment of the present invention.

FIGS. 1 to 13 show a first embodiment of the present invention;

FIG. 1 is a block diagram of a system-on-chip (SOC), which is a large-scale semiconductor integrated circuit. Provided on this integrated circuit is a voltage booster power supply circuit according to the first embodiment of the present invention.

Reference numeral 101 denotes a die chip, 102 denotes a logic circuit, 103 denotes a memory circuit, 104 denotes a voltage booster power supply circuit of the present invention, 105 denotes a lead frame, 106 denotes wire bonds, 107 denotes an input/output (I/O) section, 108 denotes bonding pads, reference symbol VDD3 denotes a first voltage, which is a voltage boosted power supply voltage, VDDM denotes a second voltage, which is a voltage for the memory, VDDL denotes a voltage for the logic circuit, VDDIO denotes a voltage for the I/O, VSS denotes a ground voltage, and VPP denotes a boosted voltage.

A large number of bonding pads 108 are provided at the I/O 107. The lead frame 105 has a large number of connection terminals. The connection terminals of the lead frame 105 are electrically connected to the bonding pads 108 on the die chip 101 through wire bonds 106 as appropriate (some of the connection terminals of the lead frame 105 are omitted from FIG. 1).

The logic circuit 102 is supplied with the logic circuit voltage VDDL, the memory 103 is supplied with the memory circuit voltage VDDM, and the voltage booster power supply circuit 104 is supplied with the boosted power supply voltage VDD3. Connected to the I/O 107 is an I/O voltage VDDIO. Each of the blocks is also connected to ground potential VSS.

The voltage booster power supply circuit 104 outputs a boosted voltage VPP, which is supplied to an internal circuit in the memory 103. A number of control signals are outputted from the memory 103 and are coupled to the voltage booster power supply circuit 104.

Typically, the I/O voltage VDDIO is higher than memory voltage VDDM and the logic circuit voltage VDDL.

The boosted power supply voltage VDD3 is also high. It may be equal to the I/O voltage VDDIO. In such a case, no power supply for the voltage booster power supply circuit 104 is required.

Furthermore, the memory voltage VDDM may be equal to the logic circuit voltage VDDL. In such a case, no power supply for the memory 103 and the voltage booster power supply circuit 104 is required.

While the memory voltage VDDM is coupled to both of the memory 103 and the voltage booster power supply circuit 104 in this configuration, a voltage equivalent to the memory voltage VDDM may be separately provided to the voltage booster power supply circuit 104.

The memory voltage VDDM may be a voltage provided by decreasing the I/O voltage VDDIO or the voltage boosted power supply voltage VDD3 through a separate regulator circuit.

Figure 2:
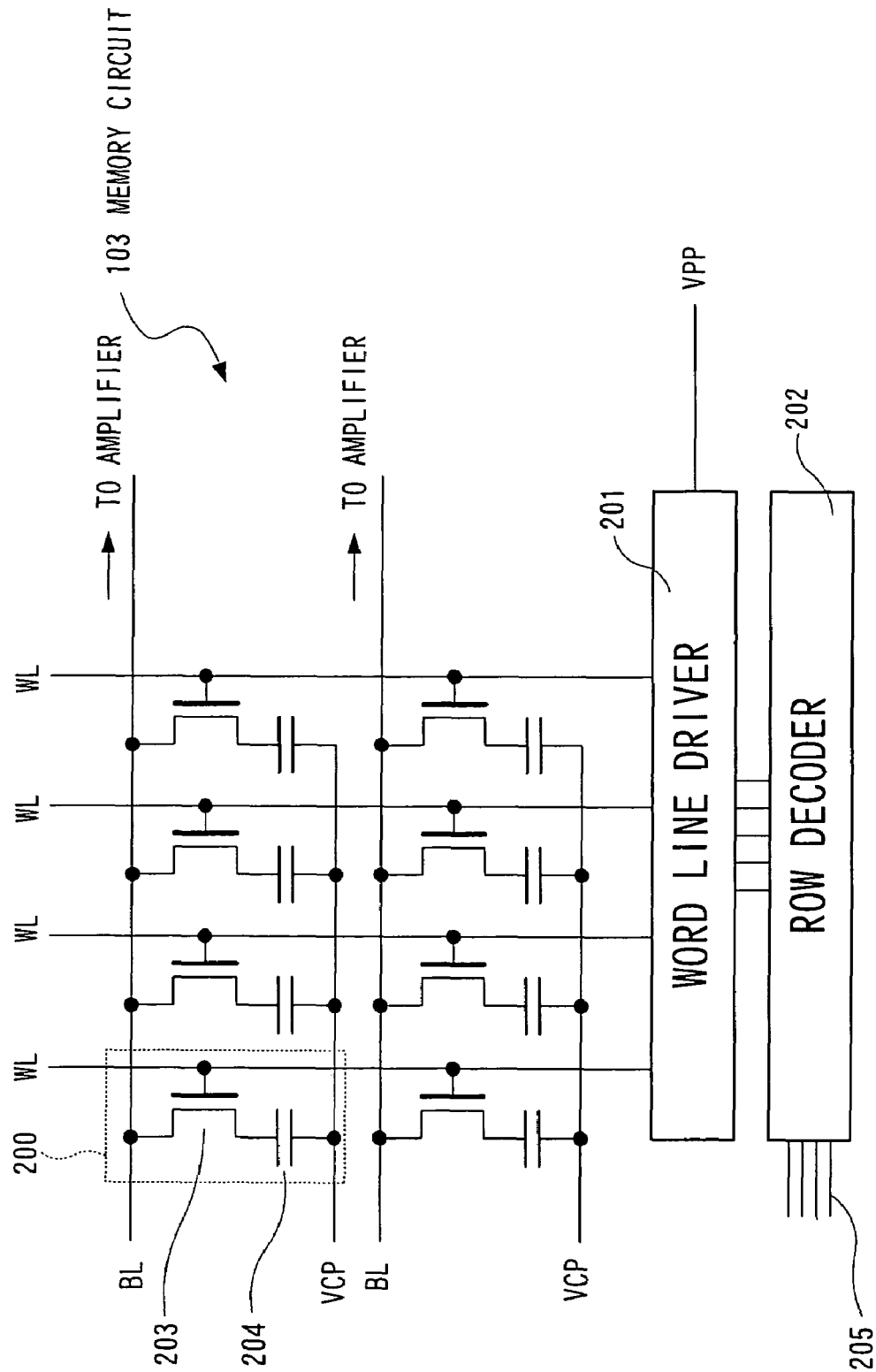
FIG. 2 is a circuit diagram of a memory array of a typical DRAM (Dynamic Random Access Memory), which is an example of an internal circuit of a memory circuit according to the embodiment.

FIG. 2 shows a circuit diagram of a memory array of a typical DRAM (Dynamic Random Access Memory), which is an example of the internal circuit of the memory 103.

Reference symbol WL denotes word lines, reference numeral 200 denotes memory cells, VCP denotes a cell plate voltage, 201 denotes a word driver, 202 denotes a row decoder, 203 denotes access transistors, 204 denotes capacitors, and 205 denotes control signals.

Each of the memory cells 200 consists of an access transistor 203 and a capacitor 204. A word line WL and a bit line BL are connected to the access transistor 203. An amplifier is connected to the bit line BL in order to amplify a minute voltage. A voltage higher than the potential on the bit line BL is applied to the word line WL in order to store a sufficient voltage of the bit line BL in the capacitor 204. A memory voltage VDDM is provided onto the bit line BL through the amplifier. A boosted voltage VPP is provided onto the word line WL through the word line driver 201. The word line driver 201 is connected to the row decoder 202 and controlled by a control signal 205.

Figure 3:
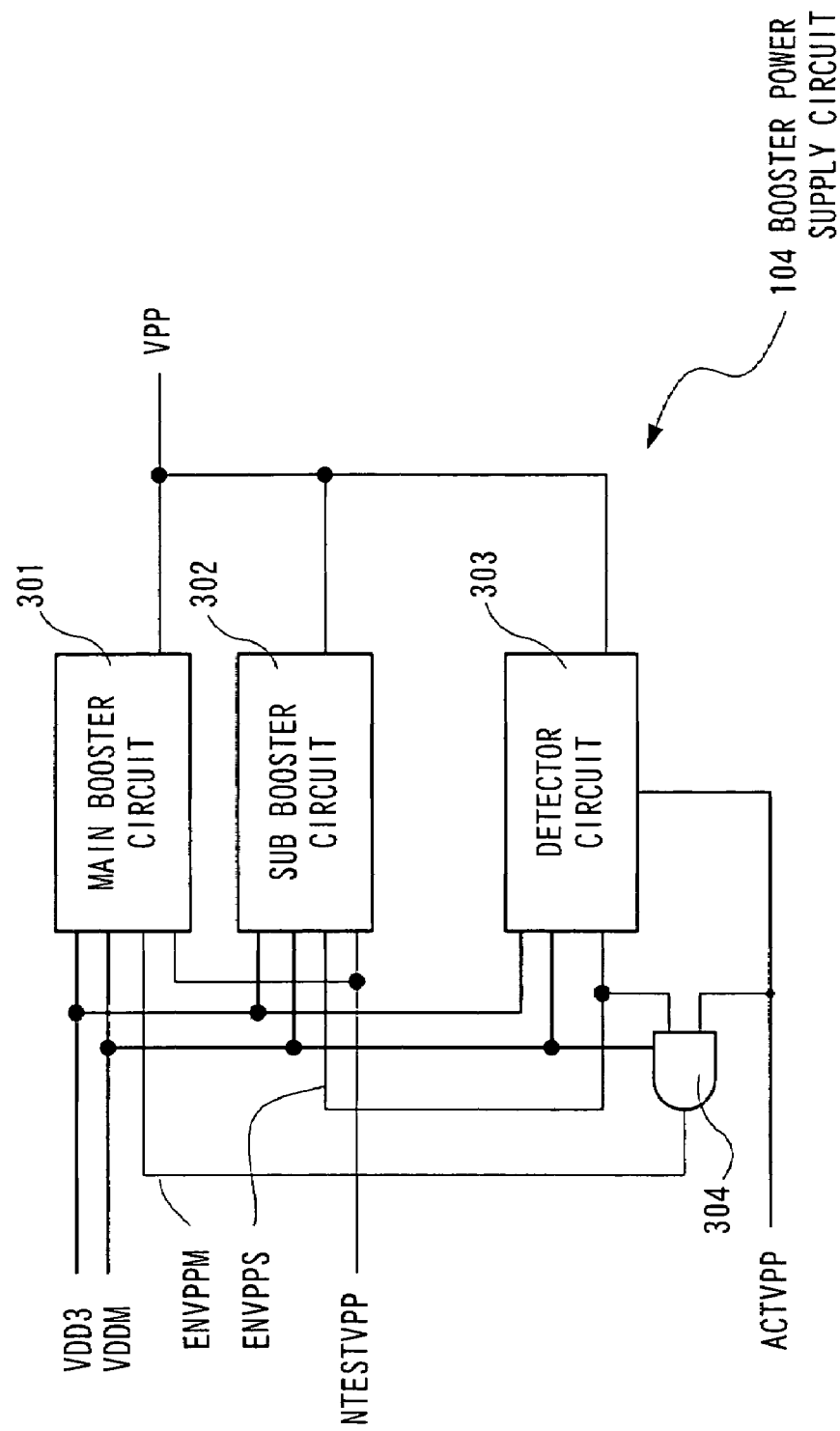
FIG. 3 is a block diagram of the voltage booster power supply circuit according to the embodiment.

FIG. 3 shows the voltage booster power supply circuit 104.

Reference numeral 301 denotes a main voltage booster circuit, 302 denotes a sub booster circuit, 303 denotes a detector circuit, 304 denotes an AND element, reference symbol ENVPPM denotes a main booster enable signal, ENVPPS denotes a sub booster enable signal, NTESTVPP denotes a test mode signal, and ACTVPP denotes a memory active signal.

The main booster circuit 301, sub booster circuit 302, and detector circuit 303 are supplied with the memory voltage VDDM and the boosted power supply voltage VDD3. The main booster circuit 301 and the sub booster circuit 302 output the boosted voltage VPP, which is provided to the detector circuit 303. The detector circuit 303 outputs a sub booster enable signal ENVPPS. The sub booster enable signal ENVPPS is coupled to the sub booster circuit 302. The sub booster enable signal ENVPPS and memory active signal ACTVPP are provided to the AND element 304. Main booster enable signal ENVPPM, which is an output of the AND element 304, is coupled to the main booster circuit 301. A test mode signal NTESTVPP is coupled to the sub booster circuit 302 and the main booster circuit 301.

Figure 4:
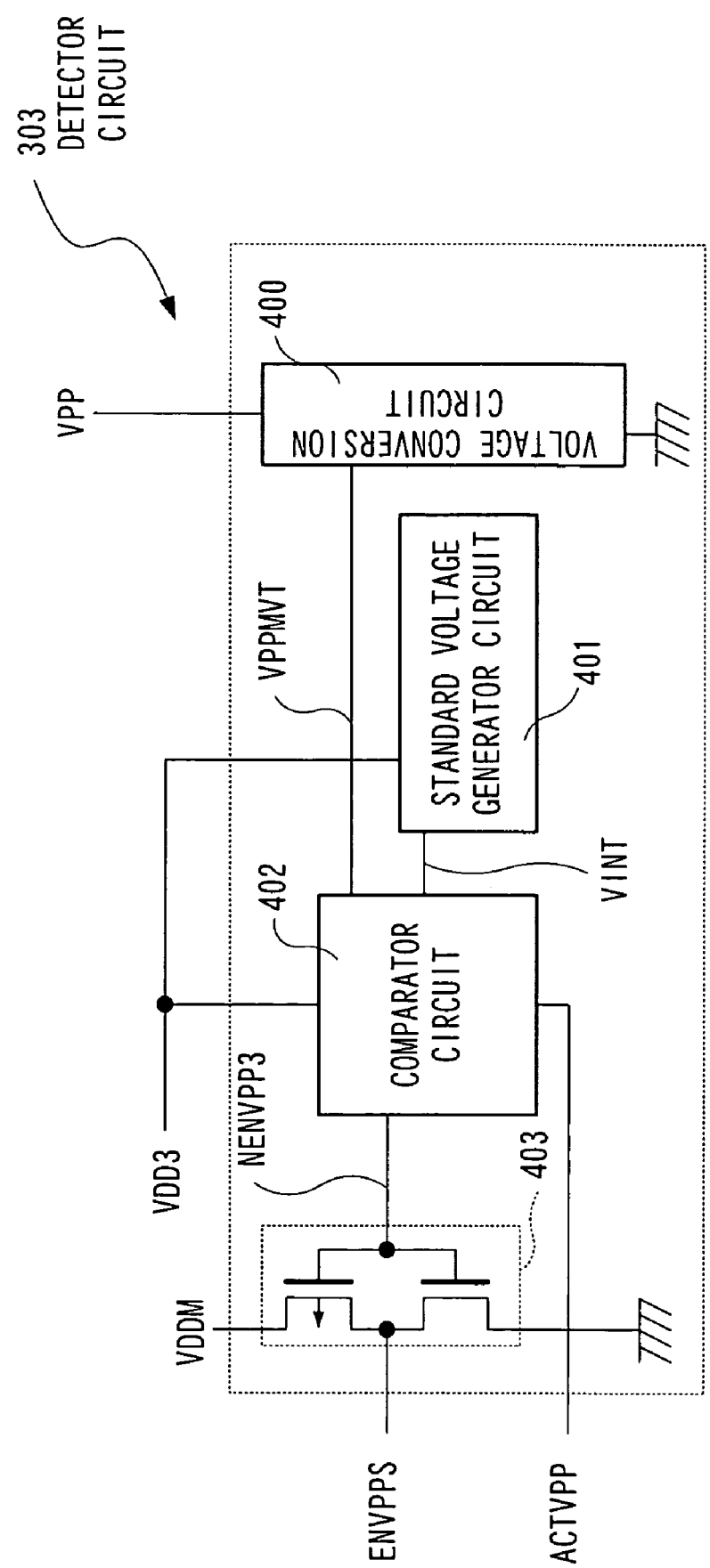
FIG. 4 is a block diagram of a detector circuit according to the embodiment.

FIG. 4 shows the detector circuit 303.

Reference numeral 400 denotes a voltage conversion circuit, 401 denotes a reference voltage generator circuit, 402 denotes a comparator circuit, 403 denotes an inverter, reference symbol VPPMVT denotes a VPP-dependent voltage (first standard voltage), VINT denotes a standard voltage (second standard voltage), NENVPP3 denotes a comparison result signal.

The voltage conversion circuit 400 is supplied with the boosted voltage VPP and outputs the VPP-dependent voltage VPPMVT. The reference voltage generator circuit 401 is supplied with the boosted power supply voltage VDD3 and outputs the standard voltage VINT. The VPP-dependent voltage VPPMVT and the standard voltage VINT are provided to the comparator circuit 402, which outputs comparator result signal NENVPP3. Also coupled to the comparator circuit 402 is memory active signal ACTVPP. Comparison result signal NENVPP3 is inputted into the inverter 403, which outputs sub booster enable signal ENVPPS. Also provided to the inverter 403 is the memory voltage VDDM. The gate oxide film of the transistor of the inverter 403 is relatively thick like one used for an I/O block.

Figure 5:
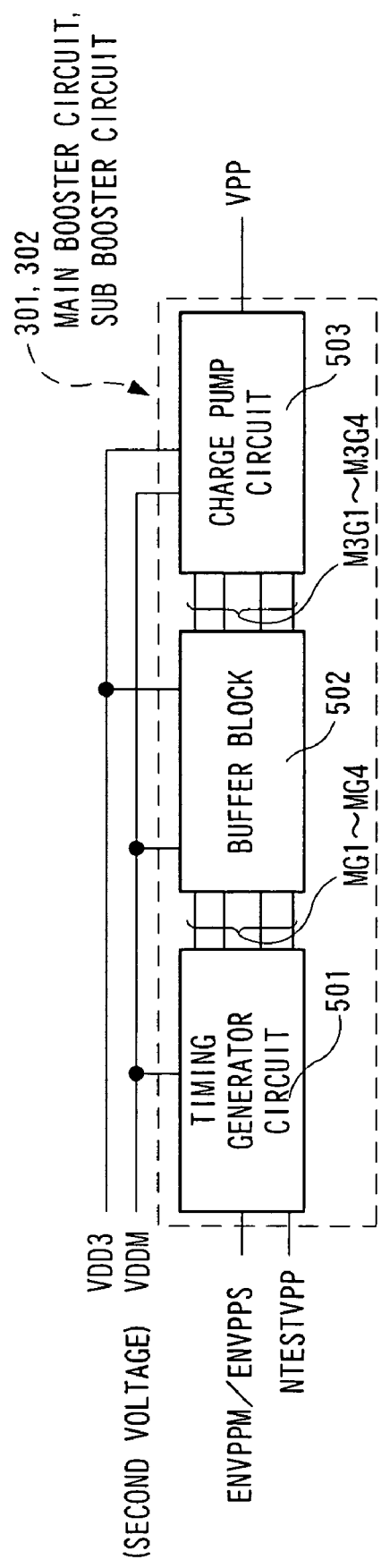
FIG. 5 is a main booster circuit and a sub booster circuit according to the embodiment.

FIG. 5 shows the main booster circuit 301 and the sub booster circuit 302 shown in FIG. 3.

The main booster circuit 301 and the sub booster circuit 302 may have the same transistors or their transistors may differ from each other in gate length and width, as appropriate. Reference numeral 501 denotes a timing generator circuit, 502 denotes a buffer block, 503 denotes a charge pump circuit, reference symbols MG1 to MG4 denote timing signals driven by the memory voltage VDDM, and M3G1 to M3G4 denote timing signals driven by the boosted power supply voltage VDD3.

The timing generator circuit 501 is supplied with the memory voltage VDDM, the buffer block 502 and the charge pump circuit 503 are supplied with the memory voltage VDDM and the boosted power supply voltage VDD3. Test mode signal NTESTVPP is provided to the timing generator circuit 501. In addition, main booster enable signal ENVPPM is provided to the timing generator circuit 501 of the main booster circuit 301 and sub booster enable signal ENVPPS is connected to the timing generator circuit 501 of the sub booster circuit 302. The timing generator circuit 501 generates timing signals MG1 to MG4. The buffer block 502 receives the signals and generates timing signals M3G1 to M3G4. Timing signals M3G1 to M3G4 are provided to the charge pump circuit 503, which generates the boosted voltage VPP.

Figure 6:
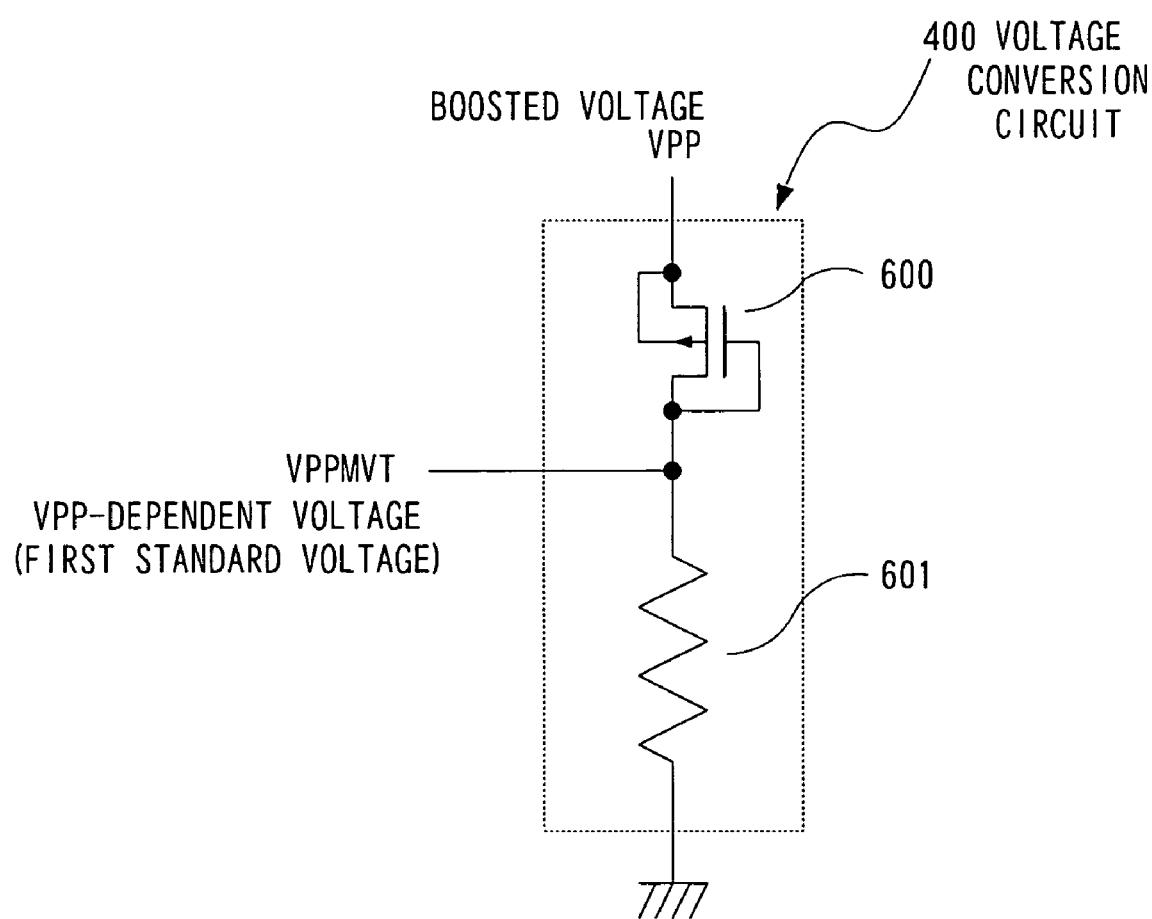
FIG. 6 is a block diagram of a voltage conversion circuit according to the first embodiment.

FIG. 6 shows the voltage conversion circuit 400 shown in FIG. 4.

Reference numeral 600 denotes a P-channel transistor and 601 denotes a load. The boosted voltage VPP is provided to the source and substrate of the P-channel transistor 600. The gate and drain of the P-channel transistor 600 are connected with each other. The P-channel transistor 600 outputs the VPP-dependent voltage VPPMVT. The P-channel transistor 600 is a so-called diode-connected transistor. The gate and drain of the P-channel transistor 600 are connected to the load 601, which is connected to the ground voltage. While the P-channel transistor 600 is used in this example, the transistor may be an N-channel diode-connected transistor.

Figure 7:
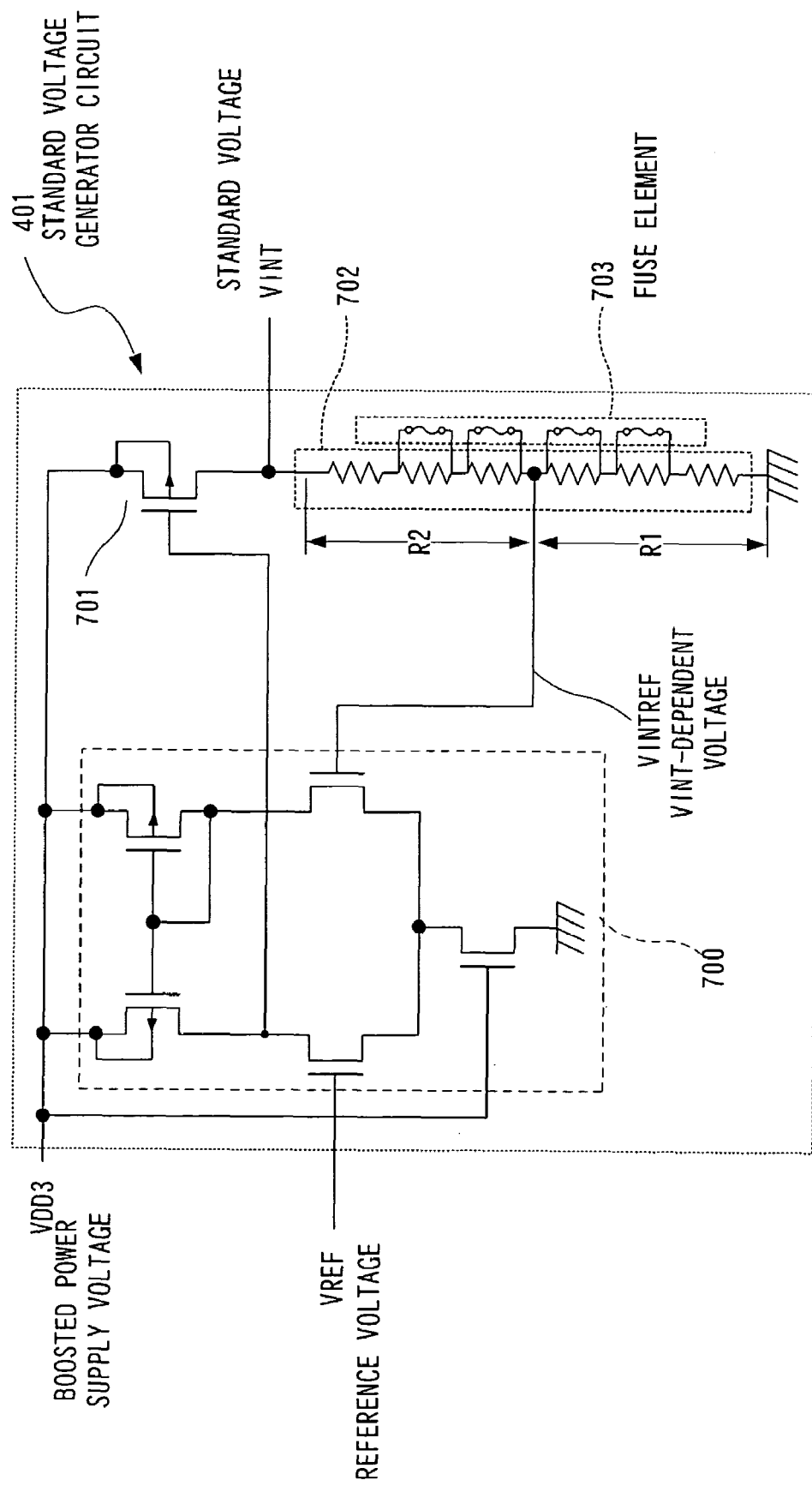
FIG. 7 is a block diagram of a reference voltage generator circuit according to the embodiment.

FIG. 7 shows the reference voltage generator circuit 401.

Reference numeral 700 denotes a differential amplifier circuit, 701 denotes a P-channel transistor, 702 denotes a set of resistor elements, 703 denotes fuse elements, reference symbol VREF denotes a reference voltage, and VINTREF denotes a VINT-dependent voltage.

The reference voltage VREF is provided from the memory 103. It is generated by a typical reference voltage generator circuit in the memory 103. The differential amplifier circuit 700 also has a typical configuration. The reference voltage VREF and the VINT-dependent voltage VINTREF are inputted into its differential inputs. The output of the differential amplifier circuit 700 is connected to the gate of the P-channel transistor 701. The source of the P-channel transistor 701 is coupled to the boosted voltage VDD3 and the drain outputs a standard voltage VINT. The standard voltage VINT is divided by the set of resistor elements 702 and the divided VINT-dependent voltage VINTREF is coupled to one of the differential inputs of the differential amplifier circuit 700 as described above. In this way, the differential amplifier circuit 700 has a negative feedback configuration. The VINT-dependent voltage VINTREF is provided to the resistor elements 702 at such a division ratio that the standard voltage VINT provides a predetermined level. Furthermore, the fuse elements 703 are connected in parallel with the resistor elements 702 so that adjustments can be made after the manufacture of this system-on-chip.

Figure 8:
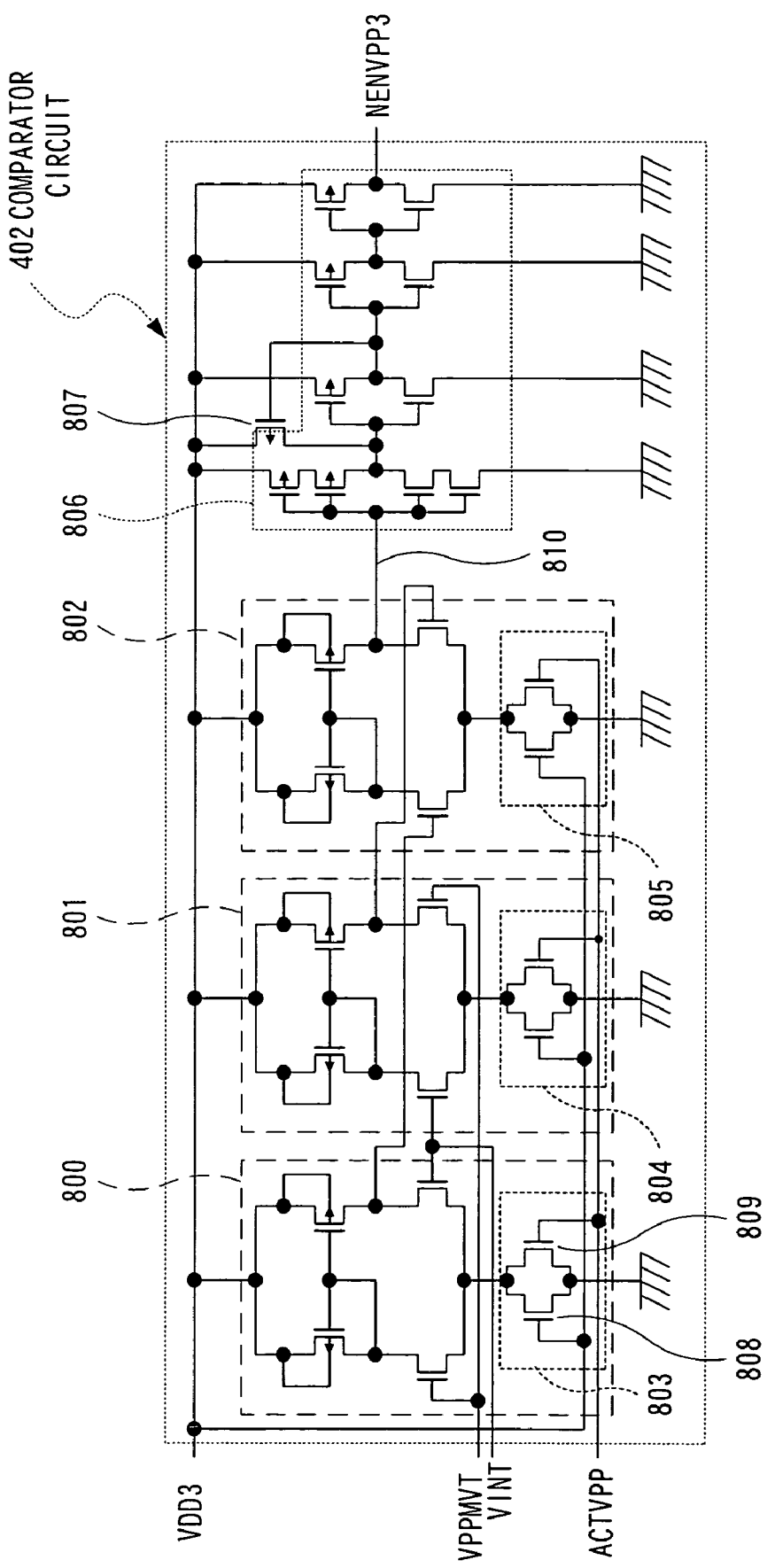
FIG. 8 is a block diagram of a comparator circuit according to the embodiment.

FIG. 8 shows the comparator circuit 402.

Reference numerals 800, 801, and 802 denote differential amplifier circuits, 803, 804, and 805 denote current sources, 806 denotes a set of inverters, 807 denotes a noise killer circuit, 808 and 809 denote N-channel transistors, and 810 denotes the output of the differential amplifier circuits.

Coupled to the two pairs of differential inputs of the differential amplifier circuits 800 and 801 are the standard voltage VINT and the VPP-dependent voltage VPPMVT. The two pairs of differential inputs are connected in such a manner that they are opposite in polarity. The outputs of the differential amplifier circuits 800, 801 are connected to the differential inputs of the differential amplifier circuit 802, which provides the output 810. The polarity of the output 810 of the differential amplifier circuit 802 is set so that output 810 of the differential amplifier circuits becomes low when the VPP-dependent voltage VPPMVT becomes lower than the standard voltage VINT. In this way, the comparator 402 has a two-stage amplification structure.

Each of the current sources 803, 804, and 805 of the differential amplifier circuits 800, 801, and 802, respectively, comprises a parallel connection of an N-channel transistor 808 and an N-channel transistor 809 that provides a higher current driving performance than the N-channel transistor 808. The N-channel transistor 808 has its gate coupled to the boosted power supply voltage VDD3 and is normally active.

The N-channel transistor 809 has its gate coupled to the memory active signal ACTVPP and becomes active or inactive depending on the memory active signal. The set of inverters 806 consists of an even number of inverters connected. Connected to the output of the first-stage inverter is the output of the noise killer circuit 807, which is a P-channel transistor, in such a manner that a Schmitt circuit arrangement is provided for preventing noise. Connected to the gate of the P-channel transistor, the noise killer circuit 807, is the output of the next stage. An output 810 from the differential amplifier circuit 810 is inputted into the set of inverters 806, which outputs a comparison result signal NENVPP3. Each circuit is supplied with the boosted power supply voltage VDD3 as its power.

Figure 9:
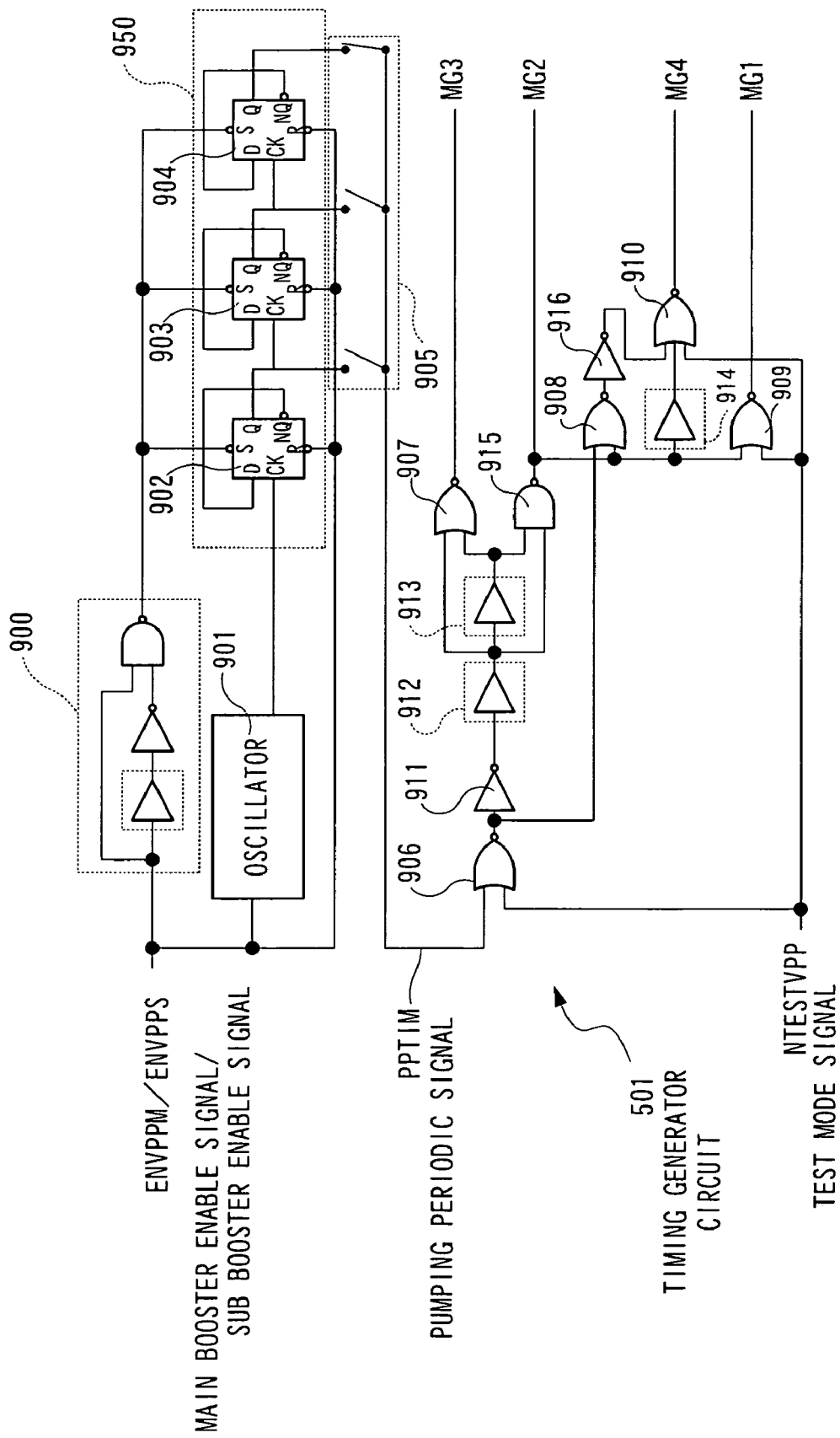
FIG. 9 is a block diagram of a timing generator circuit according to the embodiment.

FIG. 9 shows the timing generator circuit 501.

The timing generator circuit 501 is supplied with only the memory voltage VDDM as its power, which is provided to the elements within it. In the timing generator circuit 501, transistors are used that have relatively short gates capable of withstanding the memory voltage VDDM.

Reference number 900 denotes a one-shot circuit, 901 denotes an oscillator, 902, 903, and 904 denote D-flip-flops, 905 denotes a clock selector switch block, PPTIM denotes a pumping periodic signal, 906 to 910 denote NOR elements, 911 and 916 denote invertors, 912 to 914 denote delay elements, 915 denotes a NAND element, and 950 denotes a divider circuit.

If the timing generator circuit 501 is provided in the main booster circuit 301, the main booster enable signal ENVPPM is coupled to the one-shot circuit 900. If the timing generator circuit 501 is provided in the sub booster circuit 302, the sub booster enable signal ENVPPS is coupled to the one-shot circuit 900. Similarly, the main booster enable signal ENVPPM or the sub booster enable signal ENVPPS is inputted into the oscillator 901. The oscillator 901 is a typical oscillator that generates a pulse signal at predetermined intervals, and may be made up of chained inverters, for example.

The divider circuit 950 consists of a plurality of D-flip-flops. Inputted into the D-input of the D flip-flop 902 is a polarity-reversed output from the D-flip-flop 902. Inputted into its clock input CK is a pulse signal generated by the oscillator. The set signal S of the D-flip-flop has reversed polarity and the output of the one-shot circuit 900 is coupled into it. The reset signal R of the D-flip-flop 902 has reversed polarity and the output of the main booster enable signal ENVPPM or the sub booster enable signal ENVPPS is coupled into it. The connections of the D-flip-flops 903 and 904 are the same as those of the D-flip-flop 902, except that their clock inputs CK are the outputs of the D-flip-flops 902 and 903, respectively. A clock selector switch block 905 is provided between the pumping periodic signal PPTIM and the outputs of the D-flip-flops 902, 903, and 904 and the pumping periodic signal PPTIM is coupled to one of the outputs of the D-flip-flops 902, 903, and 904 as necessary. The pumping periodic signal PPTIM and a test mode signal NTESTVPP are inputted into a NOR element 906, the output of which is then coupled to an inverter 911 and a NOR element 908. The output from the inverter 911 is inputted into a delay element 912. The output of the delay element 912 is inputted into a NOR element 907, a NAND element 915, and a delay element 913. The output of the delay element 913 is inputted into a NOR element 907 and a NAND element 915. The output of the NOR element 907 is a timing signal MG3. The output of the NAND element 915 is a timing signal MG2. The timing signal MG2 is inputted into the NOR element 908, another NOR element 909, and a delay element 914. The test mode signal NTESTVPP is coupled to the NOR element 909. The output of the NOR element 908 is inputted into an inverter 916. The outputs of the inverter 916, and delay element 914 are inputted into a NOR element 910, the output of which is a timing signal MG4. Furthermore, the output of the NOR element 909 is a timing signal MG1. While the flip-flops 902, 903, and 904 are D-flip-flops in this example, T-flip-flops may be used in place of them to implement the same function.

Figure 10:
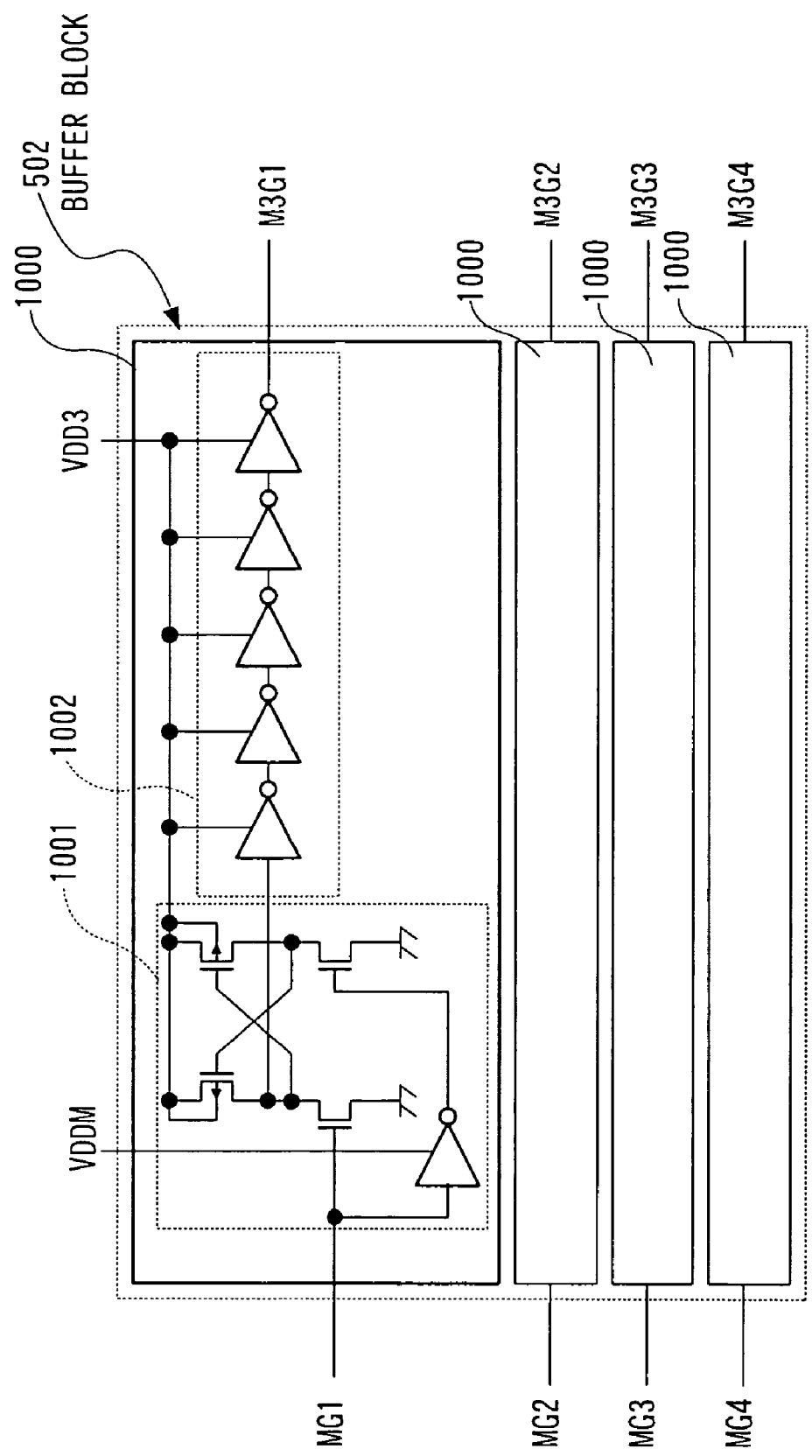
FIG. 10 is a block diagram of a buffer block according to the embodiment.

FIG. 10 shows the buffer block 502 shown in FIG. 5.

Reference number 1000 denotes a level shifting buffer, 1001 denotes a level shifter, and 1002 denotes a set of inverters.

A level shifting buffer similar to the level shifting buffer 1000 is provided for each of the timing signals MG1 to MG4 inputted into the buffer block 502. Each of the level shifting buffers, such as the buffer shown 1000, outputs the timing signals M3G1 to M3G4. Each level shifting buffer, such as the buffer shown 1000, comprises a level shifter 1001 and a set of inverters 1002. The level shifter 1001 has a cross-coupled configuration as shown. The level shifter 1001 shifts the level of the timing signals MG1 to MG4 at the level of the memory voltage VDDM to the level of the boosted power supply voltage VDD3. The output of the level shifter 1001 is inputted into the set of inverters 1002. The set of inverters 1002 is supplied with the boosted power supply voltage VDD3. The inverter set 1002 consists of a number of inverters provided in series. The inverter at the last stage has a sufficient size for driving loads, which are transistors provided in the charge pump circuit 503.

Figure 11:
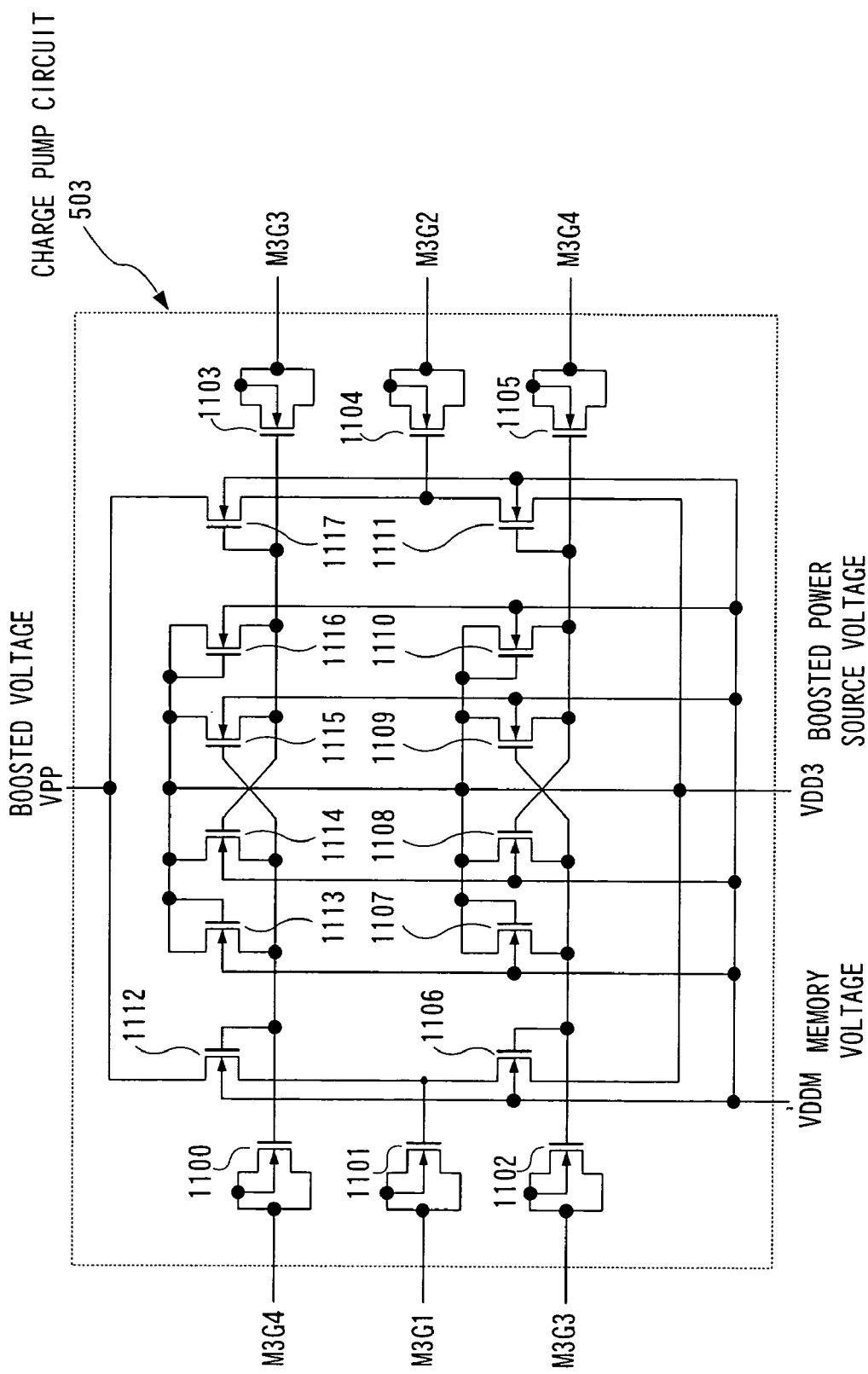
FIG. 11 is a block diagram of a charge pump circuit according to the embodiment.

FIG. 11 shows the charge pump circuit 503 shown in FIG. 5.

Reference numerals 1100 to 1117 denote N-channel transistors.

The timing signal M3G1 is inputted to the source, drain, and substrate of an N-channel transistor 1101. Similarly, the timing signal M3G2 is inputted into the source, drain, and substrate of an N-channel transistor 1104; the timing signal M3G3 is inputted into the source, drain, and substrate of N-channel transistors 1102 and 1103; and the timing signal M3G4 is inputted to the source, drain, and substrate of N-channel transistors 1100 and 1105.

Transistors 1108 and 1109 are cross-coupled. Their drains are coupled to the boosted power supply voltage VDD3 and the source of the transistor 1108 is connected to the gate of the transistor 1102 and the gate of the transistor 1109. The source of the transistor 1109 is connected to the gate of the transistor 1105 and the gate of the transistor 1108. A diode connection is made between the gate of the transistor 1102 and a transistor 1107 from the boosted power supply voltage VDD3. Similarly, a diode connection is made between the gate of the transistor 1105 and a transistor 1110 from the boosted power supply voltage VDD3.

Also connected to the gate of the transistor 1102 is the gate of a transistor 1106. Connected to the gate of the transistor 1105 is the gate of a transistor 1111.

Similarly, connected to the gates of the transistors 1100 and 1103 are transistors 1112 to 1117. In particular, transistors 1114 and 1115 are cross coupled and their drains are connected to the boosted power supply voltage VDD3. The source of the transistor 1114 is connected to the gate of the transistor 1100 and the gate of the transistor 1115. The source of the transistor 1115 is connected to the gate of the transistor 1103 and the gate of the transistor 1114. A diode connection is made between the gate of the transistor 1100 and the transistor 1113 from the boosted power supply voltage VDD3. A diode connection is made between the gate of the transistor 1103 and the transistor 1116 from the boosted power supply voltage VDD3.

Furthermore, the gate of the transistor 1112 is connected to the gate of the transistor 1100 and the gate of the transistor 1117 is connected to the gate of the transistor 1103.

The sources of the transistors 1106 and 1111 are connected to the boosted power supply voltage VDD3 and their drains are connected to the sources of the transistors 1112 and 1117, respectively. Also connected to the sources of the transistors 1112 and 1117 are the gates of the transistors 1101 and 1104, respectively. A boosted voltage VPP is outputted from the drains of the transistors 1112 and 1117.

The transistors 1100 to 1117 are isolated from a P-type substrate by a triple-well structure and the potential of the substrate can be set for each individual transistor. Rather than the ground voltage VSS, which is a typical potential of the substrate of N-channel transistors, a higher, memory voltage VDDM is connected to the substrate of the transistors 1106 to 1117.

Operation of the booster power supply circuit configured as described above according to one embodiment will be described below.

The level of the VPP-dependent voltage VPPMVT is lower than that of the boosted voltage VPP by the amount of a voltage drop in the transistor 600 in the voltage conversion circuit 400 described above and shown in FIG. 6. On the standard voltage VINT, on the other hand, a voltage proportional to the reference voltage VREF is generated by the reference voltage generator. The reference voltage VREF is desirably a voltage that does not depend on external voltages (the boosted power supply voltage VDD3 and memory voltage VDDM), in the range of practical use of the external voltages. The reference voltage VREF may be an output from a typical bandgap reference circuit, for example. However, a voltage that depends on external voltages may be used as the reference voltage VREF if required.

A voltage outputted onto the standard voltage VINT is (R2+R1)/R1×VREF, where R1 is a resistance in the path from the VINT-dependent voltage VINTREF of the set of resistor elements 702 to the ground potential and R2 is a resistance in the path to the standard voltage VINT. The standard voltage VINT can be flexibly changed after manufacturing, by breaking fuse elements 703 as appropriate to change the values of the resistances R1 and R2.

The VPP-dependent voltage VPPMVT and the standard voltage VINT are compared with each other in the comparator circuit 402 as shown in FIG. 4. If the VPP-dependent voltage VPPMVT is higher than the standard voltage VINT, a high level (the boosted power supply voltage VDD3) is outputted onto the comparison result signal NENVPP3. If the VPP-dependent voltage VPMVT is lower than the standard voltage VINT, a low level (VSS) is outputted.

The comparison result signal NENVPP3 is inputted into the inverter 403. The inverter 403 outputs the sub booster enable signal ENVPPS and the memory voltage VDDM becomes high. If the VPP-dependent voltage VPPMVT is lower than the standard voltage VINT, the sub booster enable signal ENVPPS becomes high. If the memory active signal ACTVPP is high when the sub booster enable signal ENVPPS goes high, then the main booster enable signal ENVPPM goes high. The memory active signal ACTVPP is a signal that goes high when the memory 103 is activated.

Figure 12:
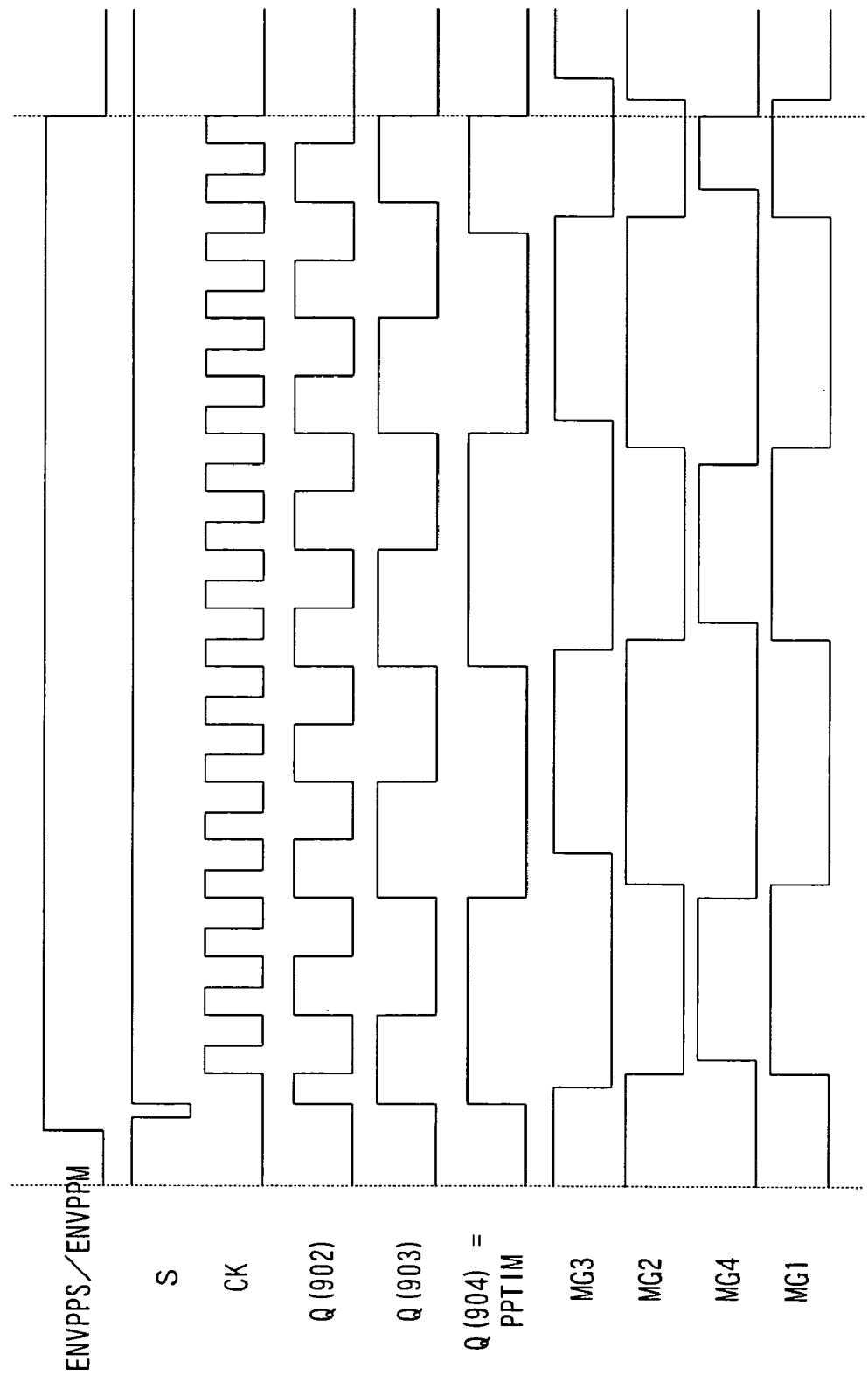
FIG. 12 is a timing diagram of main signals in the main voltage booster circuit and the sub voltage booster circuit according to the embodiment.

FIG. 12 is a timing diagram of major signals in the main booster circuit 301 and the sub booster circuit 302.

When the main booster enable signal ENVPPM and the sub booster enable signal ENVPPS become high, the oscillator 901 shown in FIG. 9 is activated and starts oscillation. The one-shot circuit 900 generates a row pulse at predetermined intervals. In response to this, the D-flip-flops 902 to 904 provide a high level at the output Q. This immediately causes the pumping periodic signal PPTIM to go high. The timing signal MG3 responds to this by going low after a delay determined by the delay element 912. After a delay determined by the delay element 913, the timing signal MG2 goes low and the timing signal MG1 goes high. Then, after a delay determined by the delay element 914, the timing signal MG4 goes high.

It takes a certain amount of time for the oscillator 901 to be activated to generate a steady clock. However, setting the output of the D-flip-flops 902 to 904 at the rising edge of the main booster enable signal ENVPPM/sub booster enable signal ENVPPS allows the detector circuit 303 to immediately detect it and cause the pumping periodic signal PPTIM to immediately become high.

When the output of the oscillator 901 provides a clock signal, the outputs of the D-flip-flops 902 to 904 generate the output of the oscillator divided by 2, 4, and 8 as a clock signal. Thus, the pumping periodic signal PPTIM becomes a clock signal.

When the pumping periodic signal PPTIM goes low, the timing signal MG4 immediately becomes low. After a delay determined by the delay element 912, the timing signal MG1 goes low and the timing signal MG2 goes high. Then, after a delay determined by the delay element 913, the timing signal MG3 goes high. During the period in which the main booster enable signal ENVPPM and the sub booster enable signal ENVPPS remains high, the operation described above is repeated.

The timing signals MG1 to MG4 are converted by a level shifting buffer 1000 to timing signals M3G1 to M3G4 at the level of the boosted power supply voltage VDD3 and inputted into the charge pump circuit 503.

When the main booster enable signal ENVPPM and the sub booster enable signal ENVPPS go low, the oscillator 901 stops oscillation and the D-flip-flops 902 to 904 are held low.

Figure 13:
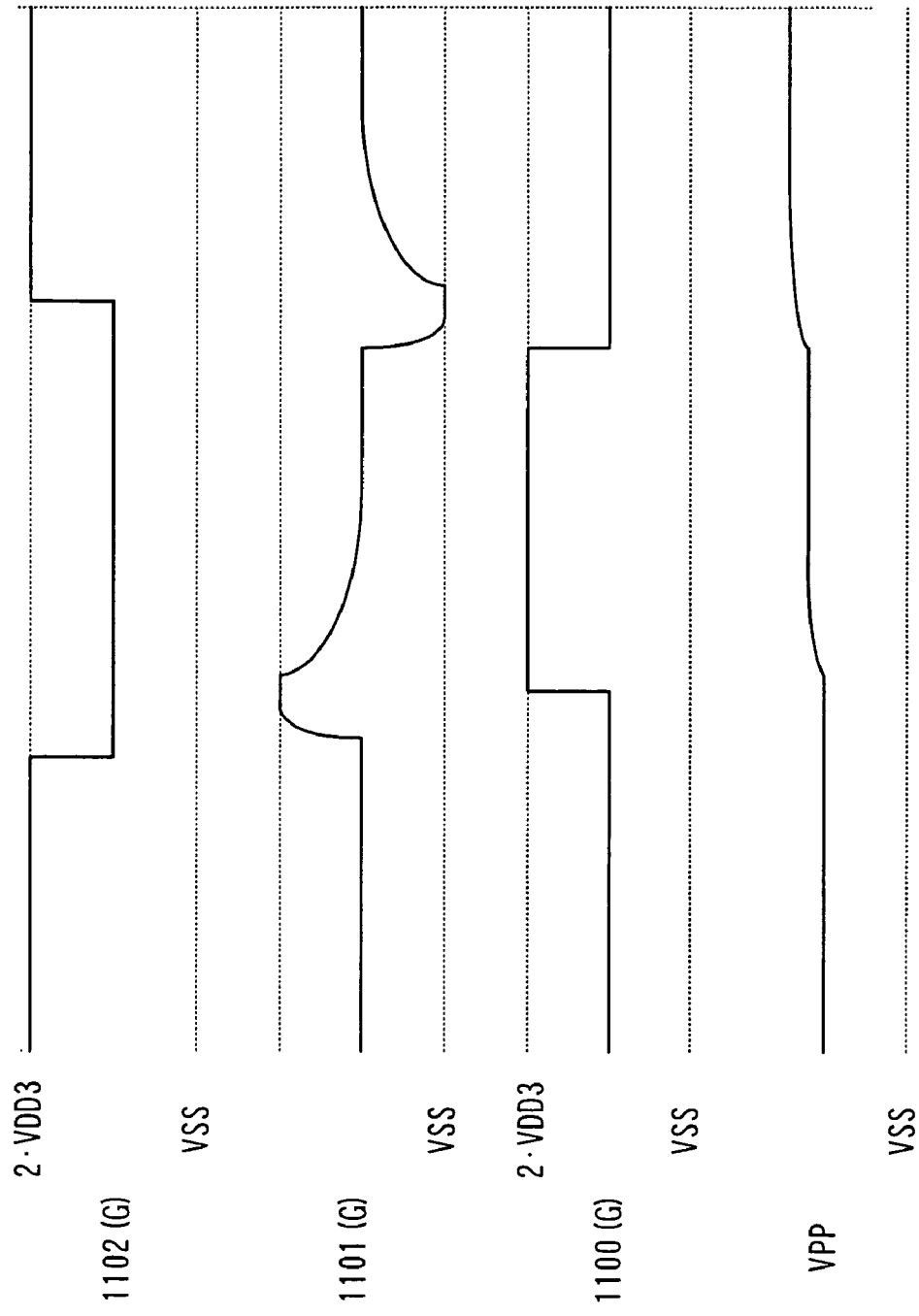
FIG. 13 is a voltage waveform chart of major nodes of the charge pump circuit in operation according to the embodiment.

FIG. 13 shows the voltages of major nodes of the charge pump circuit 503 in operation.

The voltage of the gate of the transistor 1102 driven by the timing signal M3G3 (1102 (G) in FIG. 13) is charged up to the boosted power supply voltage VDD3 by the transistors 1107 and 1108. The voltage of the gate of the transistor 1102 (1102 (G) in FIG. 13) is further pumped up by the timing signal M3G3. Consequently, it becomes a signal equivalent to 2×VDD3 when the timing signal M3G3 is high, and becomes a signal equivalent to the level of VDD3 when the timing signal M3G3 is low. When the level of the timing signal M3G3 is 2×VDD3, the transistor 1106 is turned on and the voltage of the gate of the transistor 1101 (1101 (G) in FIG. 13) becomes a signal equivalent to the level of VDD3. Similar to the voltage of the gate of the transistor 1102, the voltage of the gate of the transistor 1100 (1100 (G) in FIG. 13) becomes a signal equivalent to 2×VDD3 when the timing signal M3G4 becomes high, and becomes a signal equivalent to the level of VDD3 when it becomes low.

When the timing signal M3G3 is low and the timing signal M3G1 becomes high, the voltage of the gate of the transistor 1101 becomes a signal equivalent to 2×VDD3. Then, when the timing signal M3G4 goes high, the transistor 1100 is turned on, and the charge that has accumulated at the gate of the transistor 1101 flows onto the boosted voltage VPP. Consequently, the boosted voltage VPP increases. In this way, the boosted voltage VPP can be increased to:

2×VDD3−(threshold voltage Vt (1100) of transistor 1100).

Then, when the timing signal M3G4 goes low, the transistor 1100 is turned off and the timing signal M3G1 goes low. In response to this, the voltage of the gate of the transistor 1101 becomes low. Then, when the timing signal M3G3 goes high and the voltage of the gate of the transistor 1101 is charged up to the potential of VDD3.

Similar operation occurs for the transistors 1103 to 1105 one after the other.

By using the boosted power supply voltage VDD3 which is a relatively high voltage for the charge pump circuit 503 in this way, the boosted voltage VPP can be increased to 4.4 V when VDD3=2.5 V and Vt (1100)=0.6 V, for example.

In the case of a DRAM as shown in FIG. 2, for example, if the memory voltage VDDM is 1.5 V, the threshold voltage of the access transistor 203 is typically 0.9 V or so. Therefore, in order to adequately write a charge into memory cells, a voltage of 1.5 V+0.9 V=2.4 V or higher is required on a word line WL. Typically, a voltage in the range from 2.7 to 3.0 V is used. In the configuration described above, a sufficient boosted voltage VPP can be generated. Because a sufficient margin to the maximum voltage that can be generated is provided, an adequate current capacity can be provided.

Furthermore, rather than a ground voltage VSS, which is typically used as the substrate potential of N-channel transistors, the memory voltage VDDM higher than the ground voltage VSS is coupled to the substrate of the transistors 1106 to 1117. Because the memory voltage VDDM is used as the substrate voltage, the voltage between a gate and the substrate is 2×VDD3−VDDM, which is lower than the voltage 2×VDD3 between a gate and the substrate the voltage of which is a ground voltage, damage to elements due to a insufficient withstand voltage can be avoided.

Second Embodiment

Figure 14:
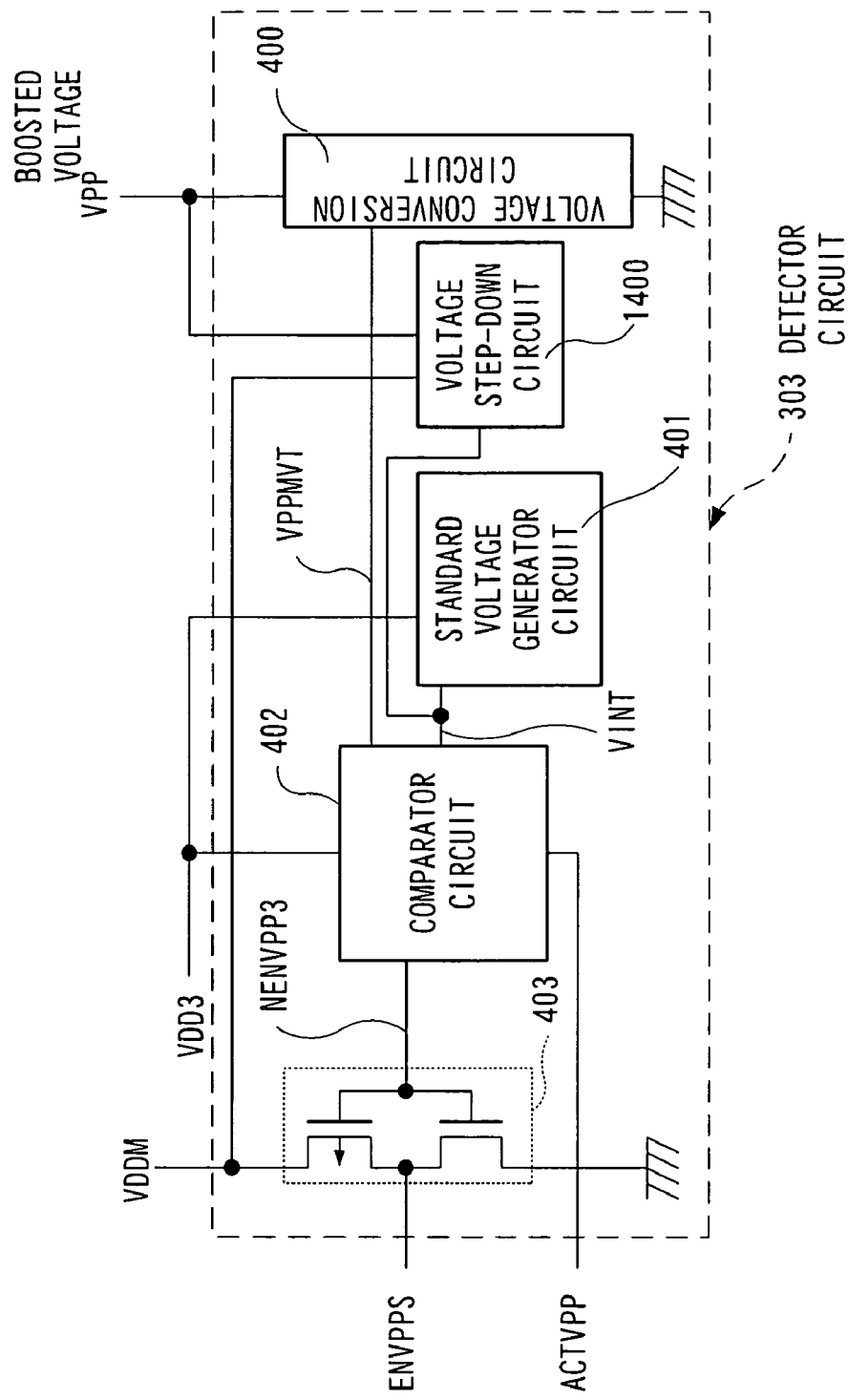
FIG. 14 is a block diagram of a detector circuit of a voltage booster power supply circuit according to a second embodiment of the present invention.
Figure 15:
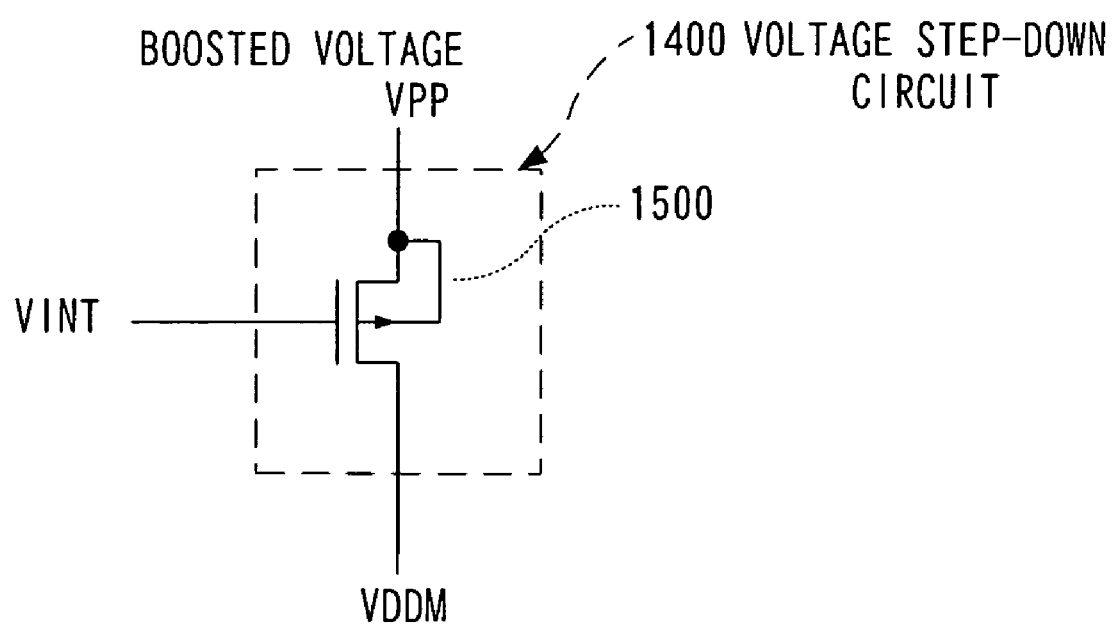
FIG. 15 is a block diagram of a voltage step-down circuit according to the second embodiment.

FIGS. 14 and 15 show a second embodiment.

The second embodiment is the same as the first embodiment, except that a detector circuit differs from the detector circuit 303 in the first embodiment shown in FIG. 3.

FIG. 14 shows a detector circuit 303 in the second embodiment of the present invention.

The detector circuit 303 differs from the one in the first embodiment in that a voltage step-down circuit (a regulator circuit) 1400 is attached. A standard voltage VINT and a boosted voltage VPP are coupled to the voltage step-down circuit 1400.

FIG. 15 shows a voltage step-down circuit 1400 in the first embodiment. Reference numeral 1500 denotes a P-channel transistor. A standard voltage VINT is supplied to the gate of the P-channel transistor 1500, a boosted voltage VPP is supplied to the source, and a memory voltage VDDM is coupled to the drain.

The standard voltage VINT is set to a lower value than the boosted voltage VPP, which is a targeted value, by the amount of a voltage drop (>threshold Vt) in a transistor 600. Accordingly, if the boosted voltage VPP exceeds the targeted, boosted voltage, the transistor 600 is turned on to release charges of the boosted voltage VPP to the memory voltage VDDM, thereby preventing overboost of the boosted voltage VPP. A ground voltage VSS may be connected to the drain of the P-channel transistor 1500.

The threshold voltage of the transistor 1500 is set to a value around the threshold voltage of the transistors 203 used in the memory circuit 103 described above.

Third Embodiment

Figure 16:
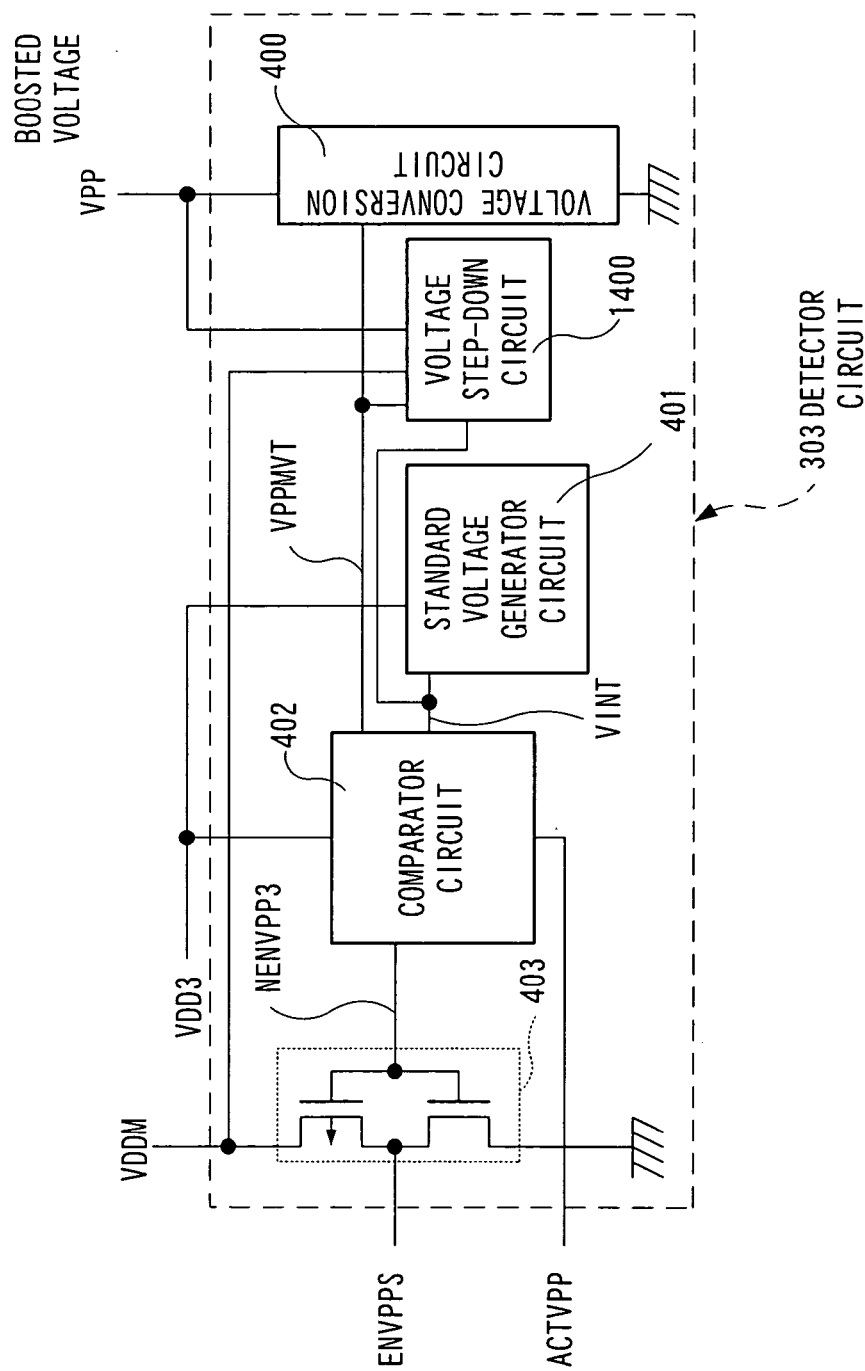
FIG. 16 is a block diagram of a detector circuit of a voltage booster power supply circuit according to a third embodiment of the present invention.
Figure 17:
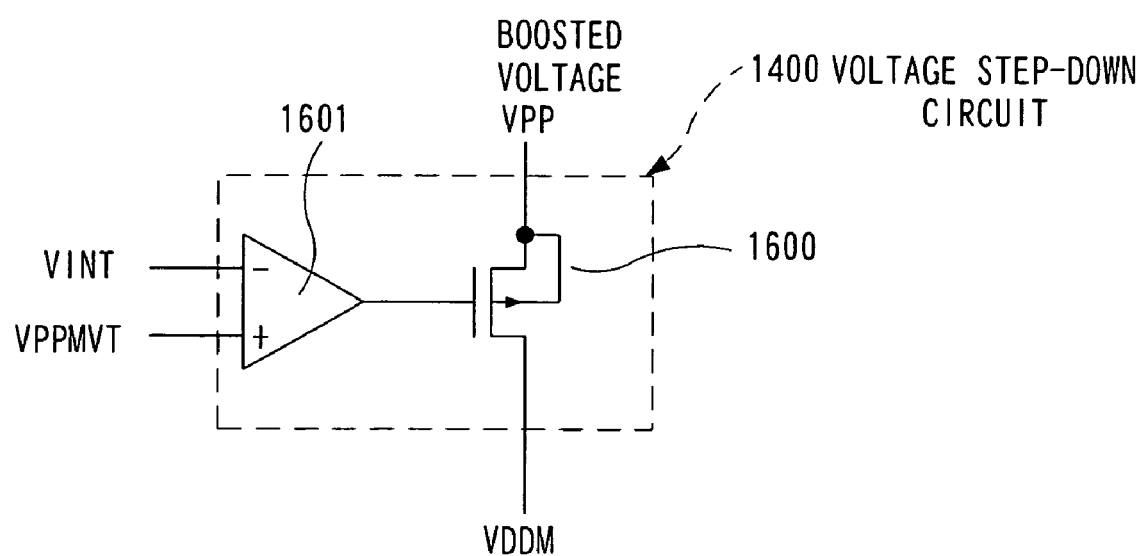
FIG. 17 is a block diagram of a voltage step-down circuit according to the third embodiment.

FIGS. 16 and 17 show a third embodiment.

The third embodiment is the same as the first embodiment, except that a detector circuit differs from the detector circuit 303 in the first embodiment shown in FIG. 3.

FIG. 16 shows a detector circuit 303 in the third embodiment of the present invention.

The detector circuit 303 differs from the one in the first embodiment in that a voltage step-down circuit 1400 is attached. A standard voltage VINT and a boosted voltage VPP and VPP-dependent voltage VPPMVT are coupled to the voltage step-down circuit 1400.

FIG. 17 shows an example of the voltage step-down circuit 1400, which differs from the one in the second embodiment.

Reference numeral 1600 denotes a P-channel transistor and 1601 denotes an operational amplifier. An output from the operational amplifier 1601 is provided to the gate of the P-channel transistor 1600, a boosted voltage VPP is provided to the source, and a memory voltage VDDM is coupled to the drain. A standard voltage VINT and a VPP-dependent voltage VPPMVT are coupled to the operational amplifier 1601.

According to this configuration, the result of comparison between the standard voltage VINT and the VPP-dependent voltage VPPMVT is amplified by the operational amplifier 1601 and the P-channel transistor 1600 is controlled, so that charges of the boosted voltage VPP are released to the memory voltage VDDM more efficiently than the first embodiment to avoid overboost of the voltage VPP. Furthermore, the drain of the P channel transistor 1600 may be coupled the ground voltage VSS.

While the functional block in the third embodiment is a memory circuit 103, the functional block may be the logic circuit 102 described above. In that case, the threshold voltage of the transistor 1600 is set to a value around the threshold voltage of the transistors making up of the logic circuit 102.

As has been described, a voltage booster power supply circuit according to the present invention provides two external power supplies. Thus, a sufficient voltage supply capacity can be provided and, in addition, circuit space saving can be achieved by forming a timing generator circuit with transistors having a thin gate oxide film.

Furthermore, the voltage booster power supply circuit has a circuit that reduces a generated voltage as needed if a voltage supplied to a charge pump circuit is high. Therefore, overboost can be prevented, and consequently reduction in the life of the transistors of the voltage booster circuit of the present invention and a memory to which the voltage booster circuit is connected can be prevented.

Furthermore, a higher voltage than the ground voltage is provided to the substrate of the transistor constituting the charge pump circuit, thereby preventing the overboosted voltage from being applied to the transistor constituting the charge pump circuit.

Furthermore, a detector circuit detects an output from the voltage booster circuit to activate the charge pump circuit before an oscillator becomes steady. Thus, a voltage drop in the output of the voltage booster circuit can be prevented and a stable voltage can be provided.

What is claimed is:

1. A voltage booster power supply circuit that generates a boosted voltage for use in a functional block, wherein first and second voltages and a ground voltage are supplied to a voltage booster circuit, said second voltage being lower than the first voltage, a timing signal is generated by a timing generator circuit according to said second voltage, said boosted voltage for use in said functional block is generated by boosting said first voltage according to said timing signal, the voltage booster power supply circuit comprising a detector circuit and said voltage booster circuit, wherein:

said voltage booster circuit comprises said timing generator circuit, a level shifter circuit, and a charge pump circuit;

said timing generator circuit being supplied with said second voltage and outputting said timing signal of said second voltage to said level shifter circuit;

said level shifter circuit outputting a timing signal of said first voltage to said charge pump circuit;

said charge pump circuit being supplied with said first voltage and generating said boosted voltage according to the timing signal of the first voltage; and said detector circuit detecting said boosted voltage to activate said timing generator circuit.

2. The voltage booster power supply circuit according to claim 1, wherein the timing signal comprises alternating high and low voltage levels.

3. The voltage booster power supply circuit according to claim 1, wherein said detector circuit comprises a voltage conversion circuit, a standard voltage generator circuit, and a comparator circuit;

said voltage conversion circuit provides a first standard voltage by decreasing said boosted voltage for use in said functional block;

said standard voltage generator circuit provides a second standard voltage by decreasing said first voltage to a predetermined voltage; and said comparator circuit compares said first standard voltage with said second standard voltage and, if said first standard voltage is lower than said second standard voltage, activates said voltage booster circuit, or if said first standard voltage is higher than said second standard voltage, deactivates said voltage booster circuit.

4. The voltage booster power supply circuit according to claim 3, wherein said standard voltage generator circuit has a voltage adjustment unit comprising an electric fuse, said voltage adjustment unit being used to adjust said second standard voltage.

5. The voltage booster power supply circuit according to claim 1, wherein the charge pump circuit is driven by said timing signal produced by converting the voltage of said timing signal to said first voltage, thereby generating said boosted voltage, said charge pump circuit comprising a plurality of transistors of which substrate is supplied with a voltage approximately equal to said second voltage.

6. The voltage booster power supply circuit according to claim 1, wherein said first voltage is equal to the voltage of power supply provided to an input/output block by which said functional block provides data to and receives data from an external element.

7. The voltage booster power supply circuit according to claim 1, wherein said second voltage is equal to the voltage of power supply provided to said functional block.

8. The voltage booster power supply circuit according to claim 1, wherein said functional block comprises a dynamic random access memory.

9. The voltage booster power supply circuit according to claim 1, wherein the thickness of a gate oxide film of a transistor within said timing generator circuit is thinner than a gate oxide film of a transistor within said charge pump circuit.

10. A voltage booster power supply circuit supplied with first and second voltages and a ground voltage, said second voltage being lower than said first voltage, said voltage booster power supply circuit boosting said first voltage to produce a boosted voltage for use in a functional block, said voltage booster power supply circuit comprising a detector circuit and a voltage booster circuit, wherein said detector circuit comprises a voltage conversion circuit, a standard voltage generator circuit, a comparator circuit, and a voltage step-down circuit;

said voltage conversion circuit provides a first standard voltage by decreasing said boosted voltage for use in said functional block;

said standard voltage generator circuit provides a second standard voltage by decreasing said first voltage;

said comparator circuit compares said first standard voltage with said second standard voltage and, if said first standard voltage is lower than said second standard voltage, activates said voltage booster circuit, or if said first standard voltage is higher than said second standard voltage, deactivates said voltage booster circuit; and said voltage step-down circuit decreases the boosted voltage for use in said functional block if the boosted voltage for use in said functional block is higher than a predetermined voltage.

11. The voltage booster power supply circuit according to claim 10, wherein said voltage step-down circuit comprises a transistor, the gate of said transistor is supplied with said second standard voltage, the source of said transistor is connected with a power supply line for providing said boosted voltage to said functional block, and the drain of said transistor is connected with one of a power supply line for providing said second voltage or a line at said ground voltage.

12. The voltage booster power supply circuit according to claim 10, wherein said voltage step-down circuit comprises an operational amplifier and a transistor, the gate of which is connected to said operational amplifier;

said first and second standard voltages are inputted into said operational amplifier;

the source of said transistor is connected to a power supply line for providing said boosted voltage to said functional block; and the drain of said transistor is connected to a power supply line of said second voltage.

13. The voltage booster power supply circuit according to claim 10, wherein said first standard voltage is lower than the boosted voltage provided to said functional block by approximately a threshold voltage of a diode connected to a load of said voltage conversion circuit in series.

14. The voltage booster power supply circuit according to claim 13, wherein said voltage conversion circuit comprises a transistor and said load, said transistor is a diode-connected transistor, the drain of said transistor is connected to said load, said load is connected to a ground voltage terminal, the source of said transistor is supplied with said boosted voltage, and said first standard voltage is outputted from a connection point between the drain of said transistor and said load.

15. The voltage booster circuit according to claim 11, wherein said functional block comprises a memory circuit, and a threshold voltage value of said transistor is approximately equal to a voltage threshold of a transistor used in said memory circuit.

16. The voltage booster circuit according to claim 12, wherein said functional block comprises a logic circuit, and a threshold voltage value of said transistor is approximately equal to a voltage threshold value of a transistor that forms said logic circuit.

17. A voltage booster power supply circuit that generates a boosted voltage for use in a functional block, wherein first and second voltages and a ground voltage are supplied to a voltage booster circuit, said second voltage being lower than said first voltage, a timing signal is generated by a timing generator circuit according to said second voltage, the boosted voltage for use in said functional block is generated by boosting said first voltage according to said timing signal, said voltage booster power supply circuit comprising a detector circuit and said voltage booster circuit, wherein said voltage booster circuit comprises said timing generator circuit, a level shifter circuit, and a charge pump circuit;

said timing generator circuit is supplied with said second voltage and outputs said timing signal at a level of said second voltage to said level shifter circuit;

said level shifter circuit outputs a timing signal at a level of said first voltage to said charge pump circuit;

said charge pump circuit is supplied with said first voltage and generates said boosted voltage according to the timing signal at a level of the first voltage;

said timing generator circuit comprises an oscillator; and if said detector circuit detects that output of said boosted voltage is lower than a predetermined voltage, said oscillator and said charge pump circuit are activated and said charge pump circuit is driven before said oscillator steadily generates a clock signal.

18. The voltage booster power supply circuit according to claim 17, wherein said timing generator circuit comprises a divider circuit; and if said detector circuit detects that said boosted voltage is lower than the predetermined voltage, said oscillator is activated and at the same time said divider circuit is set, said charge pump circuit is activated before said oscillator steadily generates said clock signal; and if said detector circuit detects that said boosted voltage exceeds the predetermined voltage, said oscillator is deactivated and said divider circuit is reset.

19. The voltage booster power supply circuit according to claim 18, wherein said divider circuit is formed by a plurality of D-flip-flops or T-flip-flops having a reset terminal and a set terminal.

* * * * *